United States Patent [19]

Onishi

[11] Patent Number: 5,162,758
[45] Date of Patent: Nov. 10, 1992

[54] DIGITAL CONTROL TYPE TEMPERATURE-COMPENSATED CRYSTAL OSCILLATOR

[75] Inventor: Masaru Onishi, Yokohama, Japan

[73] Assignee: Kabushiki Kaisha Kenwood, Tokyo, Japan

[21] Appl. No.: 819,965

[22] Filed: Jan. 13, 1992

[30] Foreign Application Priority Data

Jan. 18, 1991 [JP] Japan .................... 3-16756

[51] Int. Cl.$^5$ .......................... H03B 5/32; H03L 1/02
[52] U.S. Cl. .................................. 331/176; 331/158
[58] Field of Search ............... 331/66, 70, 116 R, 158, 331/176

[56] References Cited

U.S. PATENT DOCUMENTS 5,081,431 1/1992 Kubo et al. ................. 331/176

Primary Examiner—David Mis
Attorney, Agent, or Firm—Sixbey, Friedman, Leedom & Ferguson

[57] ABSTRACT

There are provided a memory for storing data for calculation of approximate temperature compensation data for the address data outside the temperature compensation range; a discriminator for discriminating whether the address data corresponding to the output from a temperature detector is within the temperature compensation range; a latch circuit for latching the data for calculation of approximate temperature compensation data at the start of operation; a calculator for calculating the approximate temperature compensation data in accordance with the latched data and the address data. The approximate temperature compensation data calculated by the calculator is output as a temperature compensation data when the discriminator discriminates that the address data is outside the temperature compensation range, and D/A converted the temperature compensation. The converted output is used as an oscillation frequency control voltage of the crystal oscillator.

1 Claim, 6 Drawing Sheets

| X | Y | X | Y | X | Y |
|---|---|---|---|---|---|
| 90 | 47 | 101 | 51 | 110 | 60 |
| 91 | 47 | 102 | 51 | 110 | 61 |
| 92 | 47 | 103 | 52 | 112 | 63 |
| 93 | 47 | 104 | 53 | 113 | 64 |
| 94 | 47 | 105 | 54 | 114 | 66 |
| 95 | 48 | 106 | 55 | 115 | 68 |
| 96 | 48 | 107 | 56 | | |
| 97 | 48 | 108 | 57 | | |
| 98 | 49 | 109 | 59 | | |
| 99 | 49 | | | | |
| 100 | 50 | | | | |

MEMORY STORE REGION TO X=100

FIG. 5A PRIOR ART

| TEMPERATURE INFORMATION | ADDRESS | TEMPERATURE COMPENSATION DATA | |
|---|---|---|---|
| -32 | 8 | 21 | |
| -31 | 9 | 21 | |
| -30 | 10 | 21 | ← UPPER LIMIT ADDRESS |
| -29 | 11 | 22 | |
| ⋮ | ⋮ | ⋮ | |
| 69 | 109 | 232 | |
| 70 | 110 | 231 | ← LOWER LIMIT ADDRESS |
| 71 | 111 | 231 | |
| 72 | 112 | 231 | |

TEMPERATURE COMPENSATION DATA STORE REGION

FIG. 5B PRIOR ART

| TEMPERATURE INFORMATION | ADDRESS | TEMPERATURE COMPENSATION DATA | |
|---|---|---|---|
| -32 | 8 | 125 | |
| -31 | 9 | 125 | |
| -30 | 10 | 21 | ← UPPER LIMIT ADDRESS |
| -29 | 11 | 22 | |
| ⋮ | ⋮ | ⋮ | |
| 69 | 109 | 232 | |
| 70 | 110 | 231 | ← LOWER LIMIT ADDRESS |
| 71 | 111 | 125 | |
| 72 | 112 | 125 | |

TEMPERATURE COMPENSATION DATA STORE REGION

DIGITAL CONTROL TYPE TEMPERATURE-COMPENSATED CRYSTAL OSCILLATOR

BACKGROUND OF THE INVENTION

1. Field of the Invention

The present invention relates to a digital control type temperature-compensated crystal oscillator capable of compensating at a temperature over a temperature compensation range.

2. Description of Related Background Art

A conventional digital control type temperature-compensated crystal oscillator has a structure such as shown in FIGS. 4A and 4B.

In the crystal oscillator shown in FIG. 4A, a temperature detected by a temperature detector 1 is converted into address data by an address converter 2. Temperature compensation data is read from a memory 3 at an address designated by the address data. If the detected temperature is within a temperature compensation range, the temperature compensation data read from the memory 3 is selected by a changeover circuit 4, and supplied to a D/A converter 5 to be converted into an analog voltage. This analog voltage is applied as an oscillation frequency controlling voltage to a voltage controlled crystal oscillator 6 to perform temperature compensation for the oscillation frequency of the voltage controlled crystal oscillator 6.

The memory 3 stores temperature compensation data at address corresponding to measured temperature data within the temperature compensation range, as indicated within the temperature compensation data store region in FIG. 5A. If an address converted by the address converter 2 is judged by an address discrimination circuit 7 that it is lower than the upper limit address, then an initially set upper temperature compensation data, e.g., 21, is selected by the changeover circuit 4 from an upper limit temperature compensation data register 8, and supplied to the D/A converter 5. If an address converted by the address converter 2 is judged by the address discrimination circuit 7 that it is higher than a lower limit address, then an initially set lower temperature compensation data, e.g., 231, is selected by the changeover circuit 4 from a lower limit temperature compensation data register 9, and supplied to the D/A converter 5. In this manner, if an address is over the temperature compensation range, the temperature compensation is performed using limit temperature compensation data in the memory 3.

In the crystal oscillator shown in FIG. 4B, a memory 3 stores temperature compensation data at address converted from measured temperature data within the temperature compensation range, as indicated within the temperature compensation data store regions in FIG. 5B. If an address converted by an address converter 2 is judged by an address discrimination circuit 7 that it is over the temperature compensation range, then an initially set upper temperature compensation data, e.g., 125, is selected by a changeover circuit 4 from a center temperature compensation data register 125, and supplied to a D/A converter 5. In this manner, if an address is over the temperature compensation range, the temperature compensation is performed using center temperature compensation data in the memory 3.

In the digital control type temperature-compensated crystal oscillator shown in FIG. 4A, as shown by a dot line in FIG. 5A, the upper limit temperature compensation data 21 for all address corresponding to measured temperatures lower than the temperature compensation range in store in the memory 3 outside of the temperature compensation data store region, and the lower limit temperature compensation data 231 for all address corresponding to measured temperatures higher than the temperature compensation range is stored in the memory 3 outside of the temperature compensation data store region. Furthermore, the more the measured data goes away from the temperature compensation data store region, the more the temperature compensation data goes away from an optimum temperature compensation data.

In the digital control type temperature-compensated crystal oscillator shown in FIG. 4B, although the circuit structure is simpler, the center temperature compensation data 125 for all addresses corresponding to measured temperatures over the temperature compensation range is stored in the memory 3 outside of the temperature compensation data store region. It can be said that the oscillator at measured temperatures over the temperature compensation range is not subject to temperature compensation in a practical sense. Furthermore, the temperature compensation data near at the upper and lower limits of the temperature compensation range changes greatly, resulting in frequency jump or skip.

SUMMARY OF THE INVENTION

It is an object of the present invention to provide a digital control type temperature-compensated crystal oscillator capable of compensating at a temperature outside a temperature compensation range. In the crystal oscillator, data and a calculation equation is stored in a memory, the data being used for calculating approximate temperature compensation data for a temperature outside the temperature compensation range. At the start of operation, the data use for calculating approximate temperature compensation data is latched. If a temperature is discriminated that it is over the temperature compensation range, the approximate temperature compensation data is calculated using the data for calculating approximate temperature compensation data and the calculation equation. The calculated approximate temperature compensation data is used as the temperature compensation data.

According to one aspect of the present invention, there is provided a digital control type temperature-compensated crystal oscillator, comprising:

means for detecting a temperature;

an address converter for converting an output of the temperature detecting means into address data;

a storage means for storing temperature compensation data for addresses corresponding to the address data within a temperature compensation range, and for storing data for calculation of approximate temperature compensation data for addressed corresponding to the address data over the temperature compensation range;

discriminating means for discriminating whether the address data outputted from the address converter is within the temperature compensation range;

latching means for latching the data for calculation of approximate temperature compensation data at the start of operation;

calculating means for calculating the approximate temperature compensation data in accordance with the latched data and the address data outputted from the address converter;

selecting means for selecting and outputting the temperature compensation data stored in the storage means at an address corresponding to the address data outputted from the address converter if the discriminating means discriminates that the address data is within the temperature compensation range, and selecting and outputting as the temperature compensation data the approximate temperature compensation data calculated by the calculating means if the discriminating means discriminates that the address data is over the temperature compensation range; and a D/A converter for D/A converting the temperature compensation data outputted from the selecting means into an analog signal, the analog signal being used as an oscillation frequency control voltage of the crystal oscillator.

In the digital control type temperature-compensated crystal oscillator according to the present invention, the memory stores the temperature compensation data, and the data for calculating approximate temperature compensation data for temperatures over the temperature compensation range. At the start of operation, the data for calculating approximate temperature compensation data is latched. In accordance with the latched data and the address data outputted from the address converter, the approximate temperature compensation data is calculated by the calculating means.

The discriminating means discriminates the address data converted by the address converter whether it is an address data for a temperature within the temperature compensation range. If so, the selected means selects the temperature compensation data read from the memory at the address corresponding to the address data outputted from the address converter, and supplied to the D/A converter. If the discriminating means discriminates that the address data is for a temperature over the temperature compensation range, the approximate temperature compensation data calculated by the calculating means is selected by the selecting means and supplied to the D/A converter. The D/A converter converts the supplied temperature compensation data into an analog signal.

Accordingly, even over the temperature compensation range, the temperature compensation is carried out using the approximate temperature compensation data which is sufficient for practical use. In this manner, a difference from a proper temperature compensation is made small, and a frequency jump or skip can b prevented which might otherwise occur because of a large change in temperature compensation data near at upper and lower limits of the temperature compensation range.

BRIEF DESCRIPTION OF THE DRAWINGS

FIGS. 5A and 5B are memory maps used for conventional oscillators.

DESCRIPTION OF THE PREFERRED EMBODIMENTS

Embodiments of a digital control type temperature-compensated crystal oscillator according to an embodiment of the present invention will be described.

Figure 1:
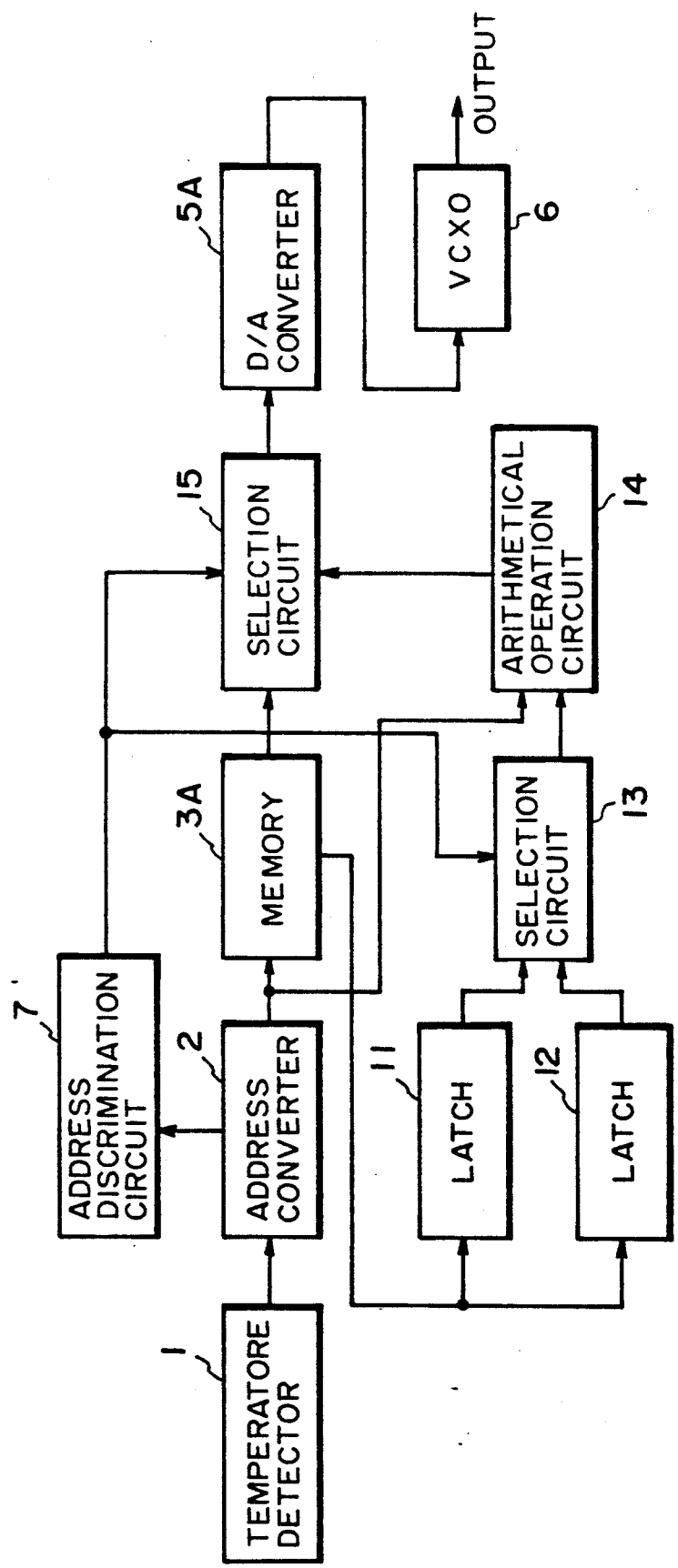
FIG. 1 is a block diagram showing the structure of an embodiment according to the present invention.

FIG. 1 is a block diagram showing the structure of a crystal oscillator according to the embodiment of the present invention.

In the digital control type temperature-compensated crystal oscillator of this embodiment, a temperature detector 1 detects a temperature and outputs data corresponding to the detected temperature. The detected temperature data from the temperature detector 1 is supplied to an address converter 2 which converts it into address data. Using this address data, a memory 3A is accessed.

The memory 3A stores temperature compensation data for addresses within a temperature compensation range, and data for calculating approximate temperature compensation data for addresses over the temperature compensation range. The data for calculating approximate temperature compensation data includes data for addresses higher than a lower limit address corresponding to an upper limit temperature within the temperature compensation range, and data for addresses lower than a upper limit address corresponding to a lower limit temperature within the temperature compensation range. The data for addresses higher than the lower limit address is read at the start of operation and latched in a latch circuit 11, whereas the data for addresses lower than the upper limit address is read at the start of operation and latched in a latch circuit 12.

An address discrimination circuit 7 discriminates addresses converted by the address converter 2 from an address lower than the upper limit address, an address higher than the lower limit address, and an address between the upper and lower limit addresses. An output from the address discrimination circuit 7 controls a selection circuit 13 which selects an output from a latch circuit 11 when an address converted by the address converter 2 is discriminated as an address lower than the upper limit address, and selects an output from a latch circuit 12 when an address converted by the address converter 2 is discriminated as an address higher than the lower limit address. An output selected by the selection circuit 13 is supplied to an arithmetical operation circuit 14 which will be described later.

The arithmetic operation circuit 14 is supplied with a latch output selected by the selection circuit 13 and with address data converted by the address converter 2, and in accordance with the supplied data, calculates approximate temperature compensation data. In this embodiment, the operation circuit 14 calculates the following equation (1):

$$Y = ax^2 + bx + c \qquad (1)$$

In the equation (1), x represents address data converted by the address converter 2. This second-order equation (1) calculates approximate temperature compensation data for an address higher than the lower limit address. The decimal fraction of the calculation results is rounded through half-adjust to obtain the temperature compensation data for the address higher than the lower limit.

The data for calculating approximate temperature compensation data for addresses converted by the address converter 2 and higher than the lower limit address is stored in the latch circuit 12, the data including a=7/200, b=−127/20, and c=335.

The data for calculating approximate temperature compensation data for addresses for converted by the address counter 2 and lower than the upper limit address is stored in the latch circuit 12, the data including a′, b′ and c′ which are selected by the selection circuit 13 to calculate approximate temperature compensation data using converted address data.

One of the temperature compensation data read from the memory 3A and the approximate temperature compensation data calculated by the arithmetic calculation circuit 14 is supplied to and selected by a selection circuit 15 which is controlled by an output from the address discrimination circuit 7. If an address converted by the address converter 2 is an address lower than the upper limit address or an address higher than the lower limit address, an output of the operation circuit 14, i.e., approximate temperature compensation data, is selected. On the other hand, if an address converted by the address converter 2 is an address within the temperature compensation range, the temperature compensation data read from the memory 3A is selected.

The data outputted from the selection circuit is supplied to a D/A circuit to convert it in analog data which is then applied as an oscillation frequency controlling voltage to a voltage-controlled crystal oscillator 6 to control the oscillation frequency of the voltage-controlled crystal oscillator 5.

In the crystal oscillator of the present embodiment constructed as above, temperature data detected by the temperature detector 1 is converted by the address converter 2 into address data. The temperature compensation data stored in the memory 3A at the address designated by the address data is read and supplied to the selection circuit 15. In this case, if an address higher than the lower limit address or lower than the upper limit address is designated, there is no corresponding temperature compensation data stored in the memory 3A. An address converted by the address converter 2 is discriminated by the address discrimination circuit 7 whether it is an address lower than the upper limit address, an address higher than the lower limit address, or an address within the upper and lower limit addresses.

If an address is discriminated by the address discrimination circuit 7 as an address within the upper and lower limit addresses, the selection circuit selects the temperature compensation data read from the memory 3A, and outputs it to the D/A converter 5A to convert it into analog data. Using this analog temperature compensation data, the oscillation frequency of the voltage controlled crystal oscillator 6 is compensated so that the oscillator 6 oscillates at the temperature-compensated oscillation frequency.

At the start of operation, the data for calculating approximate temperature compensation data stored in the memory 3A for addresses lower than the upper limit address is latched by the latch circuit 11, and the data for calculating approximate temperature compensation data is latched by the latch circuit 12. If a converted address is discriminated by the address discrimination circuit 7 as an address lower than the upper limit address, an output from the latch circuit 11 is selected. On the other hand, if it is discriminated as an address higher than the lower limit address, an output from the latch circuit 12 is selected. The selected output is supplied to the arithmetic operation circuit 14 which calculates approximate temperature compensation data using the latch output and converted address. Using the calculated approximate temperature compensation data, the oscillation frequency of the voltage controlled crystal oscillator 6 is compensated so that the oscillator 6 oscillates at the oscillation frequency temperature-compensated by the approximate temperature compensation data.

Figures 2A, 2B:
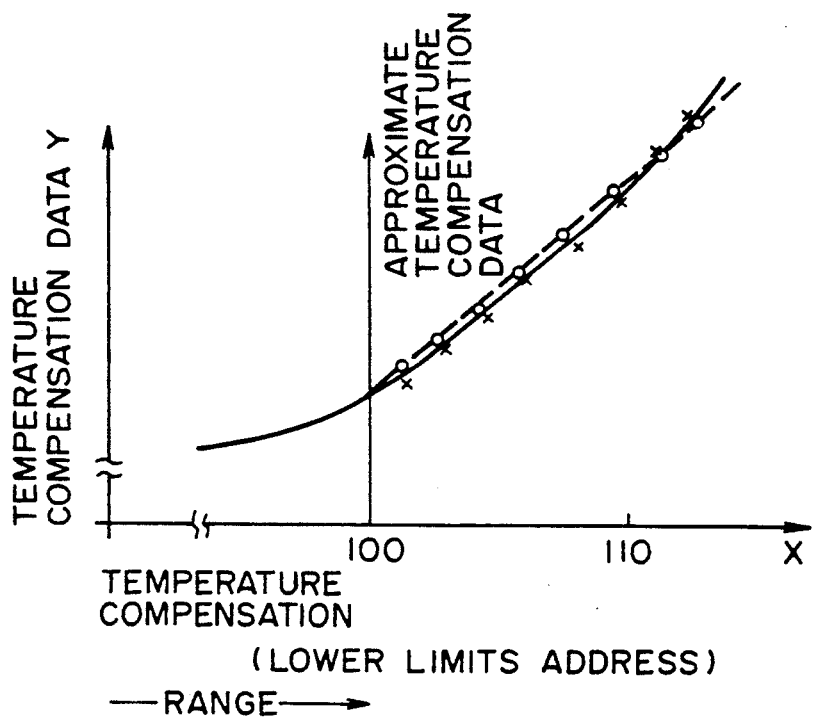
FIGS. 2A and 2B are a graph showing temperature compensation data including approximate temperature compensation data, relative to addresses, and a table showing the values of calculated approximate temperature compensation data and part of temperature compensation data for addresses within the temperature compensation range.

The approximate temperature compensation data calculated by the operation circuit 14 from the equation (1) for the addresses higher than the lower limit address is indicated at cross marks in FIG. 2A. As seen from this graph, the proper temperature compensation data indicated by a solid line in FIG. 2A is substantially the same as the approximate temperature compensation data. The memory 3A of small capacity can thus be used while presenting no practical problem of temperature compensation. This is also true for approximate temperature compensation data for addresses lower than the upper limit address. The values of calculated approximate temperature compensation data are shown in the table of FIG. 2B, the table also showing part of temperature compensation data for addresses within the temperature compensation range.

Another embodiment of the present invention will be described next.

Figure 3:
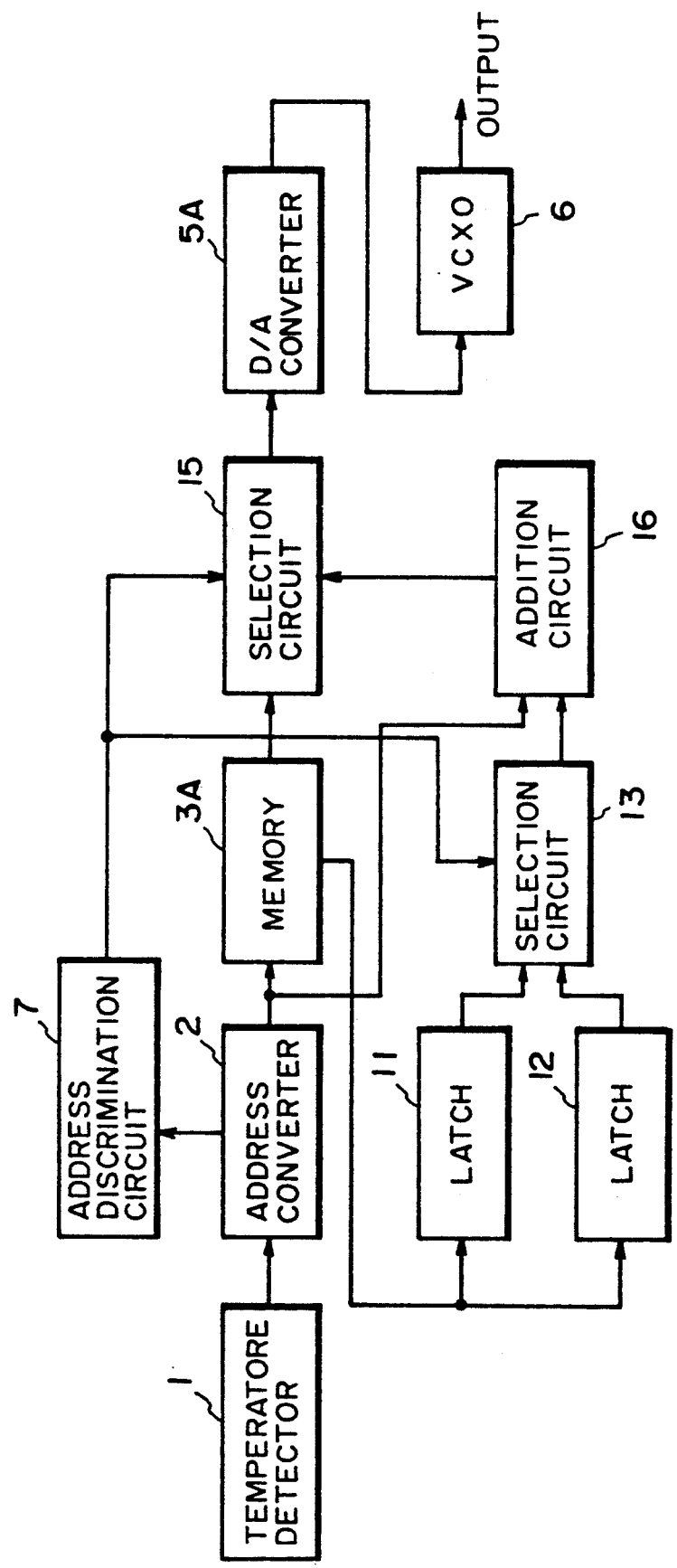
FIG. 3 is a block diagram showing the structure of another embodiment according to the present invention.
Figure 4A:
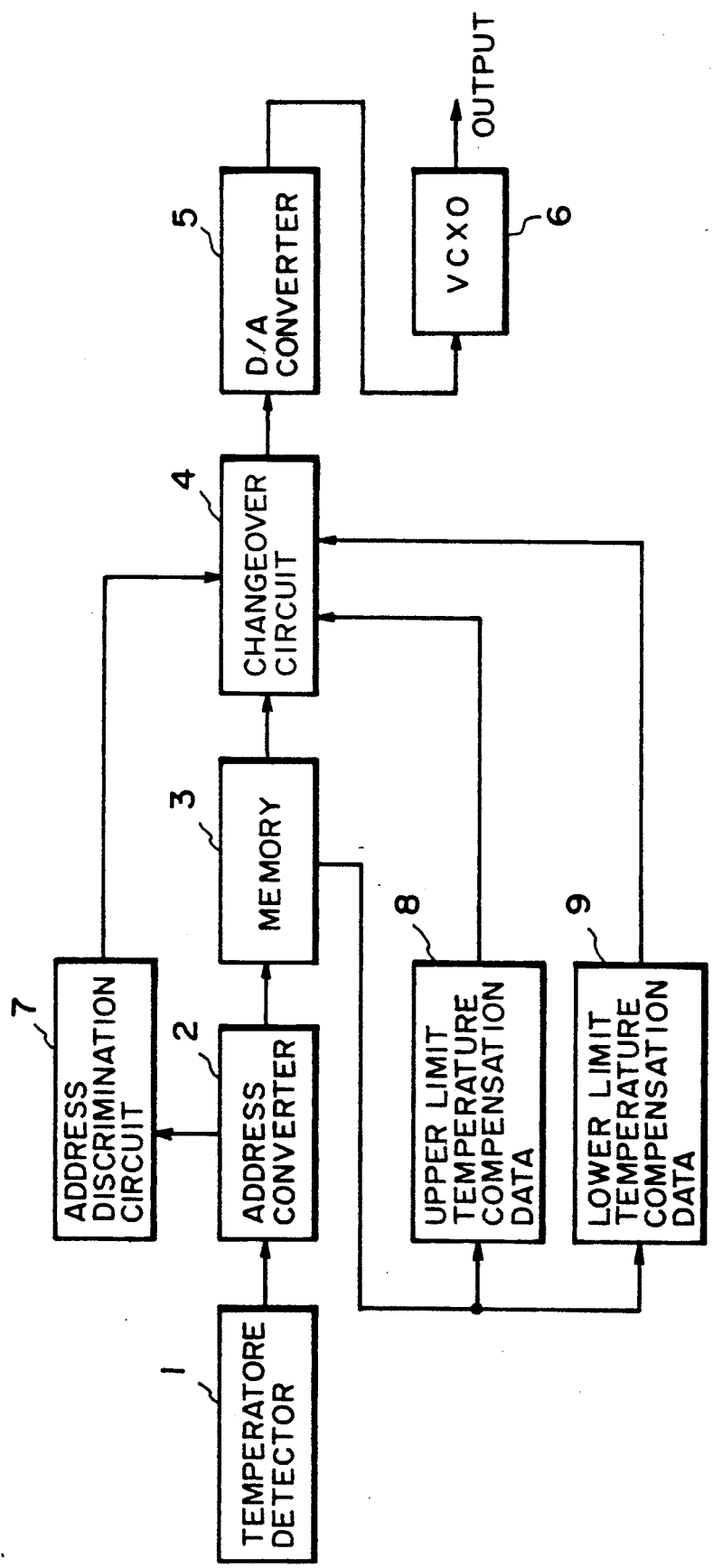
FIGS. 4A and 4B are block diagrams showing the structure of conventional oscillators.
Figure 4B:
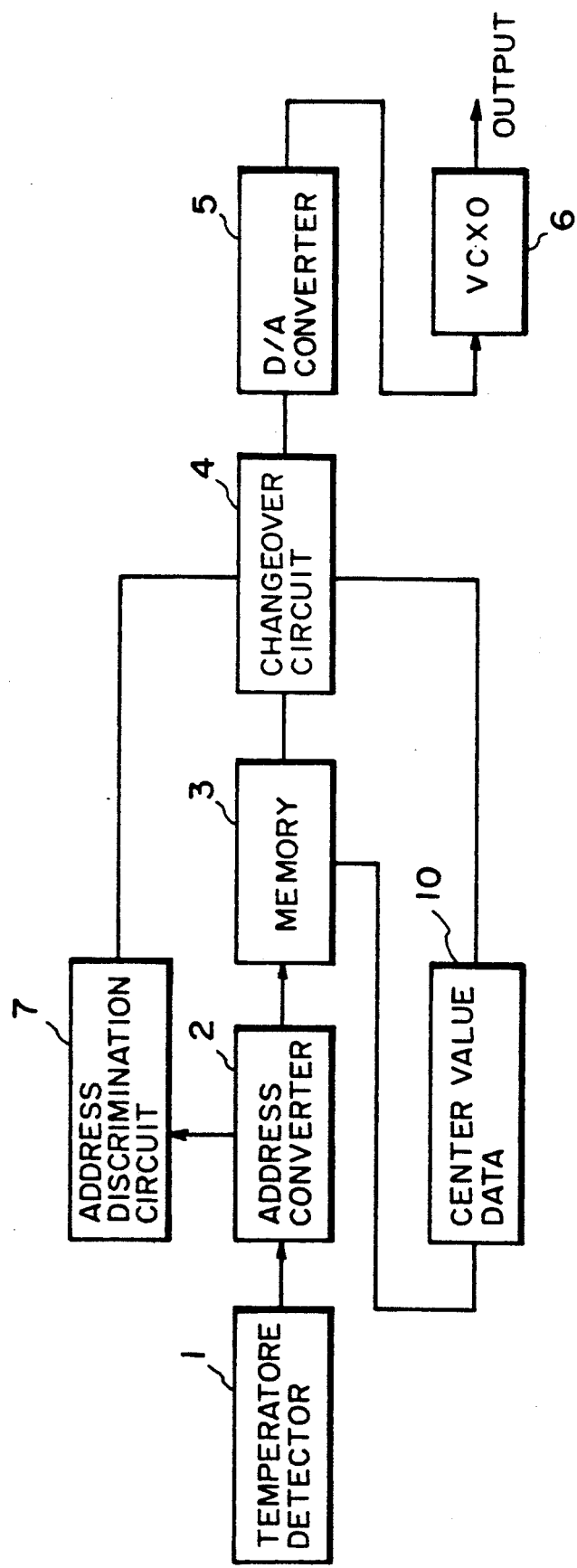

FIG. 3 is a block diagram showing the structure of another embodiment of the present invention. In this embodiment, instead of the arithmetic operation circuit 14 of the first embodiment, an adder 16 is provided for calculating approximate temperature compensation data through addition operation.

In this embodiment using the adder 16, the number of data in each of latch circuits 11 and 12 for calculating approximate temperature compensation data is one datum. For example, the data d in the latch circuit 12 for addresses higher than the upper limit address, is d=−50. The adder 16 calculates an equation y=x+d.

At the start of operation, the data d=−50 is latched by the latch circuit 12, and added to address data x by the adder 16. If an address converted by the address converter 2 is an address higher than the lower limit address, the addition data at the adder 16 is converted by the D/A converter into an analog signal which is then applied as a frequency controlling voltage to the voltage controlled oscillator 6 so that the oscillator 6 oscillates at the oscillation frequency temperature-compensated by the approximate temperature compensation data.

The approximate temperature compensation data calculated by the adder 16 for the address higher than the lower limit address is indicated at circle marks in FIG. 2A. As seen from this graph, the proper temperature compensation data indicated by a solid line in FIG. 2A is substantially the same as the approximate temperature compensation data. The adder 16 is simpler than the arithmetic operation circuit 14, and the memory 3A of small capacity can thus be used while presenting no practical problem of temperature compensation. This is also true for approximate temperature compensation data for addresses lower than the upper limit address. The number of data in the memory 3A for calculating approximate temperature compensation data is only two data.

As appreciated from the foregoing description of the present invention, approximate temperature compensation data for temperatures over the temperature compensation range is calculated and, using this data the oscillation frequency of the voltage controlled crystal oscillator is compensated. Therefore, the temperature compensation range can be expanded with substantially no increase in the memory capacity. Furthermore, the temperature compensation data will not change greatly near at limit addresses, preventing frequency jump.

What is claimed is:

1. A digital control type temperature-compensated crystal oscillator, comprising:
   means for detecting a temperature;
   an address converter for converting an output of the temperature detecting means into address data;
   a storage means for storing temperature compensation data for addresses corresponding to the address data within a temperature compensation range, and for storing data for calculation of approximate temperature compensation data for addresses corresponding to the address data over the temperature compensation range;
   discriminating means for discriminating whether the address data outputted from the address converter is within the temperature compensation range;
   latching means for latching the data for calculation of approximate temperature compensation data at the start of operation;
   calculating means for calculating the approximate temperature compensation data in accordance with the latched data and the address data outputted from the address converter;
   selecting means for selecting and outputting the temperature compensation data stored in the storage means at an address corresponding to the address data outputted from the address converter if the discriminating means discriminates that the address data is within the temperature compensation range, and selecting and outputting as the temperature compensation data the approximate temperature compensation data calculated by the calculating means if the discriminating means discriminates that the address data is over the temperature compensation range; and
   a D/A converter for D/A converting the temperature compensation data outputted from the selecting means into an analog signal, the analog signal being used as an oscillation frequency control voltage of the crystal oscillator.

* * * * *